United States Patent
Hu et al.

(10) Patent No.: US 11,219,134 B2
(45) Date of Patent: Jan. 4, 2022

(54) DEVICE AND METHOD FOR DETECTING MISSING ELEMENT ON CIRCUIT BOARD

(71) Applicants: Hefei BOE Vision-Electronic Technology Co., Ltd., Anhui (CN); BOE TECHNOLOGY GROUP CO., LTD., Beijing (CN)

(72) Inventors: Qianqian Hu, Beijing (CN); Chendong Xie, Beijing (CN); Jie Yang, Beijing (CN); Yanxin Zhang, Beijing (CN)

(73) Assignees: HEFEI BOE VISION-ELECTRONIC TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 185 days.

(21) Appl. No.: 16/551,932

(22) Filed: Aug. 27, 2019

(65) Prior Publication Data

US 2020/0245475 A1 Jul. 30, 2020

(30) Foreign Application Priority Data

Jan. 28, 2019 (CN) .......................... 201910081787.1

(51) Int. Cl.
  *G01R 31/28* (2006.01)
  *H05K 5/00* (2006.01)
(52) U.S. Cl.
  CPC ......... *H05K 5/006* (2013.01); *G01R 31/2887* (2013.01)
(58) Field of Classification Search
  CPC ............ G01R 31/2887; G01R 31/2808; G01R 31/2886; H05K 5/006
  See application file for complete search history.

(56) References Cited

U.S. PATENT DOCUMENTS 3,143,702 A * 8/1964 Kohler ............... G01R 31/2817
              324/413
3,806,800 A * 4/1974 Bove .................. G01R 31/2886
              324/538

(Continued)

FOREIGN PATENT DOCUMENTS

CN    201917640       8/2011
CN    102967820       3/2013
(Continued)

OTHER PUBLICATIONS

Office action from Chinese Application No. 201910081787.1 dated Sep. 3, 2020.

(Continued)

*Primary Examiner* — Patrick Assouad
*Assistant Examiner* — Demetrius R Pretlow
(74) *Attorney, Agent, or Firm* — Calfee, Halter & Griswold LLP

(57) ABSTRACT

A device for detecting a missing element on a circuit board comprising a positioning tray, a data processing assembly, a lifting control assembly, and a detecting assembly. The positioning tray supports and positions a circuit board to be tested. The data processing assembly is connected with the lifting control assembly and the detecting assembly, and sends a control signal to the lifting control assembly, receives detection data sent by the detecting assembly, and compares the detection data with preset reference data to obtain a detection result of a missing element. The detecting assembly moves up and down between an initial position and a preset position under the control of the lifting control assembly, and sends the detection data to the data processing assembly according to a contact state with elements on the circuit board to be tested at the preset position.

13 Claims, 2 Drawing Sheets

(56) References Cited

U.S. PATENT DOCUMENTS

| | | | | |
|---|---|---|---|---|
| 4,463,310 | A | * | 7/1984 | Whitley ............ G01R 31/2813 324/537 |
| 4,557,043 | A | * | 12/1985 | Starski ............. G01R 31/2813 29/741 |
| 4,588,945 | A | * | 5/1986 | Groves ............ G01R 31/31915 324/73.1 |
| 5,043,656 | A | * | 8/1991 | Clark ................ G01R 1/06711 324/754.02 |
| 5,448,574 | A | * | 9/1995 | Yamaguchi ........... G01R 31/67 714/712 |
| 5,589,802 | A | * | 12/1996 | O'Shaughnessy ..... G01R 27/14 324/548 |
| 5,596,587 | A | * | 1/1997 | Douglas ......... G01R 31/318342 702/123 |
| 5,623,502 | A | * | 4/1997 | Wang ............ G01R 31/318541 714/726 |
| 5,861,743 | A | * | 1/1999 | Pye ................. G01R 31/31926 324/763.01 |
| 6,456,089 | B1 | * | 9/2002 | Vuksic ............... G01R 31/2812 324/512 |
| 6,683,449 | B1 | * | 1/2004 | Bell ................... H01L 23/4093 257/718 |
| 2001/0019169 | A1 | * | 9/2001 | Marino ................. H01L 24/49 257/673 |
| 2004/0145383 | A1 | * | 7/2004 | Brunner .............. G01R 31/302 324/750.19 |
| 2004/0164752 | A1 | * | 8/2004 | Crook ............... G01R 1/06766 324/725 |
| 2006/0072116 | A1 | * | 4/2006 | Schmitt ............... G01N 21/251 356/446 |
| 2007/0013772 | A1 | * | 1/2007 | Tham .............. G01N 21/95684 348/87 |
| 2008/0088318 | A1 | * | 4/2008 | Nair .................. G01R 31/2813 324/548 |
| 2011/0115520 | A1 | * | 5/2011 | Horsky ................. G01R 31/64 324/764.01 |
| 2013/0187674 | A1 | * | 7/2013 | Rada .................... H04B 17/11 324/750.02 |
| 2014/0001342 | A1 | * | 1/2014 | Ke ......................... G01R 31/68 250/208.2 |
| 2014/0091820 | A1 | * | 4/2014 | Emery .................. G01R 31/01 324/754.1 |
| 2014/0290049 | A1 | * | 10/2014 | Lussier .................. G06F 30/17 29/745 |
| 2014/0375300 | A1 | * | 12/2014 | Tanaka ..................... G06F 1/185 324/76.11 |
| 2015/0012791 | A1 | * | 1/2015 | Kim ....................... G11C 29/36 714/744 |
| 2017/0370987 | A1 | * | 12/2017 | Lussier ............. G05B 19/4099 |
| 2018/0138015 | A1 | * | 5/2018 | Ghantasala ........... G01R 27/04 |
| 2019/0035074 | A1 | * | 1/2019 | Ishida ................... G06T 7/0008 |
| 2019/0128957 | A1 | * | 5/2019 | Sanekata ............... H05K 3/0008 |
| 2020/0024083 | A1 | * | 1/2020 | Takata ............. H01L 21/67727 |
| 2020/0033396 | A1 | * | 1/2020 | Feucht ............... G01R 31/2808 |

FOREIGN PATENT DOCUMENTS

| | | |
|---|---|---|
| CN | 103063959 | 4/2013 |
| CN | 203786043 U | 8/2014 |
| CN | 203929821 U | 11/2014 |
| CN | 203965580 | 11/2014 |
| CN | 105203897 | 12/2015 |
| CN | 105572570 | 5/2016 |
| CN | 105717442 | 6/2016 |
| CN | 106199383 | 12/2016 |
| CN | 106643855 | 5/2017 |
| CN | 207249037 | 4/2018 |
| CN | 108152713 A | 6/2018 |
| CN | 108700628 | 10/2018 |
| KR | 10-2005-0110586 | 11/2005 |

OTHER PUBLICATIONS

Chen Fei et al., "Inspection of missing electronic component on Printed Circuit Board based on IMAQ", Microcomputer Information (Embedded and SOC) Dec. 31, 2007, pp. 307-309, vol. 23, No. 4-2, China.

* cited by examiner

DEVICE AND METHOD FOR DETECTING MISSING ELEMENT ON CIRCUIT BOARD

CROSS REFERENCE TO RELATED APPLICATIONS

The present application claims the benefit of a Chinese Patent Application No. 201910081787.1, filed on Jan. 28, 2019, the entire disclosures of which are incorporated herein by reference.

FIELD

The present disclosure relates to the technical field of circuit boards, in particular to a device and a method for detecting a missing element on a circuit board.

BACKGROUND

The manufacturing industry needs to check whether all elements on a circuit board are present after the elements are installed on the circuit board, so as not to cause the circuit board to lose function or become unusable due to missing elements. The currently adopted method is optical detection, i.e. a camera acquires an image of a circuit board to be tested to obtain the data of each test point on the circuit board, and compares the data of each test point with the corresponding pre-stored (or preset) qualified data and analyzes the data. If the data of the test point indicates an error, the defect is marked on the acquired circuit board image through an image processing step for repair by maintenance personnel.

The disadvantages of optical detection are as follows: an image acquiring device and an image processing device are needed, so the cost is relatively high; the image acquisition range is limited, so the single detection range is small; an image acquiring step, an image processing step, a data analyzing step and other steps are needed, so the efficiency is low.

SUMMARY

In view of this, some exemplary embodiments provide an improved device and method for detecting a missing element on a circuit board.

Some exemplary embodiments provide a device for detecting a missing element on a circuit board, which includes a positioning tray, a data processing assembly, a lifting control assembly, and a detecting assembly, wherein:

the positioning tray is configured to support and position a circuit board to be tested;

the data processing assembly is configured to be respectively connected with the lifting control assembly and the detecting assembly, send a control signal to the lifting control assembly, receive detection data sent by the detecting assembly, and compare the detection data with preset reference data to obtain a detection result of a missing element;

the lifting control assembly is configured to be connected with the detecting assembly and control the lifting of the detecting assembly according to the control signal;

the detecting assembly is configured to move up and down between an initial position and a preset position under the control of the lifting control assembly, and send the detection data to the data processing assembly according to a contact state with elements on the circuit board to be tested at the preset position.

Optionally, the detecting assembly comprises a detection panel and a plurality of detection posts, wherein the detection panel is provided with a plurality of through holes penetrating through the detection panel, the detection panel is configured to be connected with the lifting control assembly, drive the detection posts to lift under the control of the lifting control assembly, be set to be at a first level after the detection panel is lowered to the preset position, and be set to be at a second level after the detection panel rises to the initial position;

wherein each of the detection posts comprises a conductive block and an insulative post connected to each other, the insulative post penetrates through the through hole and is assembled with the through hole in a transition fit manner, the conductive block is configured to be electrically connected with the data processing assembly, and sends the first level to the data processing assembly when the detection panel is lowered to the preset position and the conductive block contacts the detection panel, and sends the second level to the data processing assembly when the detection panel is lowered to the preset position and the conductive block detaches from the detection panel; the insulative post is configured to prop up the conductive block to detach the conductive block from the detection panel when contacting with an element on the circuit board to be tested.

Optionally, the force asserted by gravity on the conductive block is greater than the resistance of the insulative post moving in the through hole, so that the conductive block falls due to gravity when the detection panel rises, and contacts the detection panel after the detection panel rises to the initial position.

Optionally, the detection panel is a metal plate.

Optionally, a plurality of the through holes are arranged in an array in the detection panel.

Optionally, the positions of the plurality of through holes correspond to the positions of elements on the circuit board to be tested.

Optionally, the through hole is a circular hole, the conductive block is a cylinder, the insulative post is a cylinder, and the diameter of the bottom surface of the conductive block is larger than the diameter of the through hole.

Optionally, the material of the insulative post comprises at least one of plastic, silica gel and rubber.

Optionally, the lifting control assembly comprises a lifting controller and a lifting column, wherein the lifting controller is configured to be electrically connected with the data processing assembly and drive the lifting column to lift according to the control signal sent by the data processing assembly; wherein the lifting column is configured to be connected with the detection panel and drive the detection panel to lift under the control of the lifting controller.

Optionally, the driving mode adopted by the lifting control assembly comprises at least one of linear motor driving, pneumatic driving and hydraulic driving.

Optionally, the positioning tray is rectangular.

Some exemplary embodiments of the present disclosure also provide a method for detecting a missing element on a circuit board using a device for detecting the missing element on the circuit board, wherein the device for detecting the missing element on a circuit board comprises a positioning tray, a data processing assembly, a lifting control assembly and a detecting assembly.

wherein the method comprises the following steps:

placing the circuit board to be tested at a predetermined position on the positioning tray;

sending a control signal to the lifting control assembly by the data processing assembly;

controlling the detecting assembly to move up and down between an initial position and a preset position according to the control signal by the lifting control assembly;

sending detection data to the data processing assembly according to a contact state with elements on the circuit board to be tested at the preset position by the detecting assembly; and receiving the detection data and comparing the detection data with preset reference data to obtain a detection result of a missing element by the data processing assembly.

Optionally, the detecting assembly comprises a detection panel and a plurality of detection posts, each of the detection posts comprises an insulative post and a conductive block connected to each other;

the step of sending detection data to the data processing assembly according to a contact state with elements on the circuit board to be tested at the preset position by the detecting assembly comprises:

setting the detection panel to be at a first level when the detection panel is lowered to the preset position and to be at a second level after the detection panel rises to the initial position;

sending the first level to the data processing assembly when the detection panel is lowered to the preset position and the conductive block contacts the detection panel, and sending the second level to the data processing assembly when the detection panel is lowered to the preset position and the conductive block detaches from the detection panel; and when the insulative post is in contact with an element on the circuit board to be tested, propping up the conductive block to detach the conductive block from the detection panel.

Optionally, the method further comprises: when the detection panel is in the initial position, setting the detection panel to be at the second level, and when the detection panel is in the initial position, causing the conductive block to be in contact with the detection panel, and setting the level of the conductive block to the second level.

Optionally, the first level is a high level and the second level is a low level; or alternatively the first level is a low level and the second level is high level.

DETAILED DESCRIPTION

In order that the above objects, features and advantages of the present disclosure can be more clearly understood, the present disclosure will be described in further detail below with reference to the accompanying drawings and detailed description.

Figure 1:
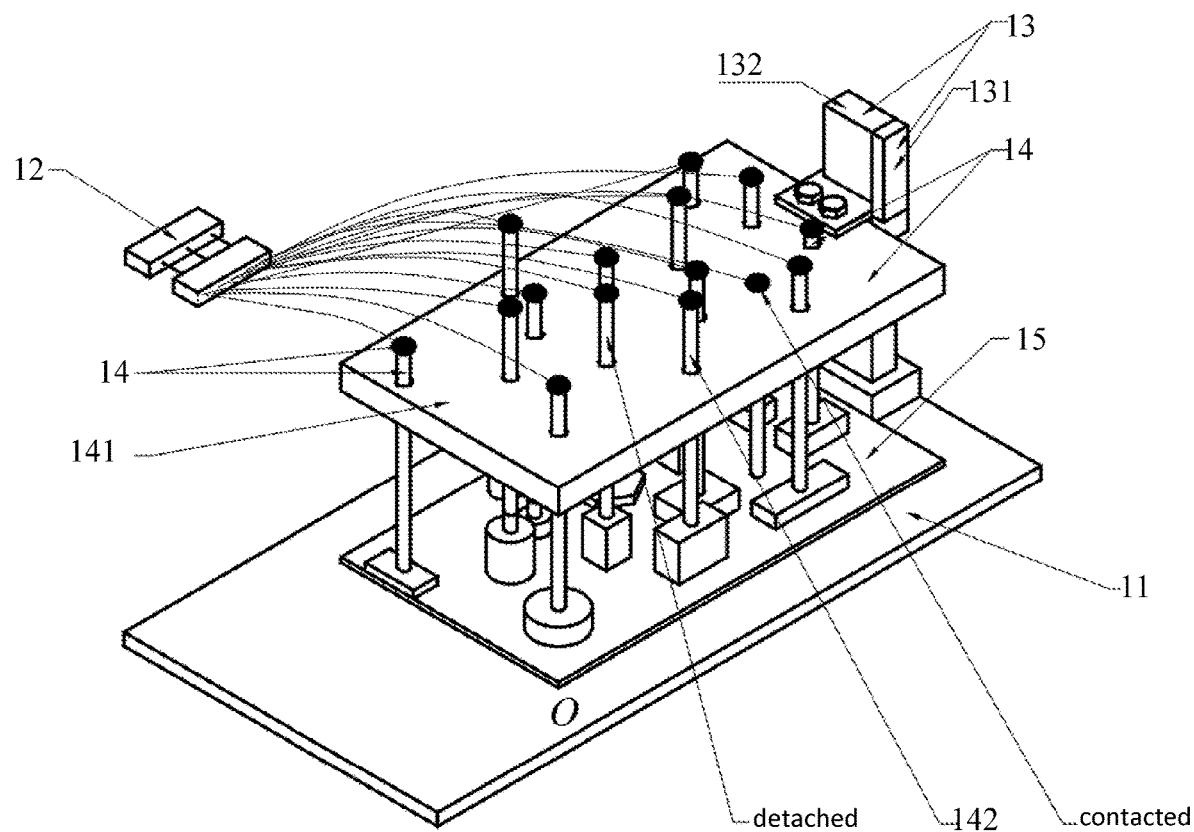
FIG. 1 shows a schematic structural view of a device for detecting a missing element on a circuit board according to some exemplary embodiments.

Referring to FIG. 1, there is shown a schematic structural view of a device for detecting a missing element on a circuit board provided by some exemplary embodiments. The device comprises a positioning tray 11, a data processing assembly 12, a lifting control assembly 13 and a detecting assembly 14.

The positioning tray 11 is configured to support and position the circuit board 15 to be tested.

The data processing assembly 12 is configured to be respectively connected with the lifting control assembly 13 and the detecting assembly 14, send a control signal to the lifting control assembly 13, receive detection data sent by the detecting assembly 14, and compare the detection data with preset reference data to obtain a detection result of a missing element.

The lifting control assembly 13 is configured to be connected with the detecting assembly 14, and controls the lifting of the detecting assembly 14 according to the control signal.

The detecting assembly 14 is configured to move up and down between an initial position and a preset position under the control of the lifting control assembly 13, and send the detection data to the data processing assembly 12 according to a contact state with elements on the circuit board to be tested at the preset position.

The device for detecting a missing element on a circuit board provided by some exemplary embodiments of the present disclosure has the following technical effects: the device for detecting the missing element on a circuit board comprises a positioning tray, a data processing assembly, a lifting control assembly and a detecting assembly, wherein the positioning tray supports and positions the circuit board to be tested, the data processing assembly sends a control signal to the lifting control assembly, receives the detection data sent by the detecting assembly, and compares the detection data with preset reference data to obtain a detection result of a missing element, the lifting control assembly controls the lifting of the detecting assembly according to the control signal, the detecting assembly moves up and down between an initial position and a preset position under the control of the lifting control assembly, and sends detection data to the data processing assembly according to the contact state with elements on the circuit board to be tested at the preset position, therefore whether there is any element missing on the circuit board can be quickly and efficiently detected; and compared with the optical detection method, the detecting device has the advantages of accurate and simple testing, low cost, improved efficiency and the like.

In some of the above exemplary embodiments, a positioning origin, such as point O shown in FIG. 1, may be provided on the positioning tray 11. The circuit board to be tested is placed on the positioning tray 11 with reference to the positioning origin. The connection of the data processing assembly 12, the lifting control assembly 13 and the detecting assembly 14 may be wired connection or wireless connection, and the present disclosure will take wireless connection as an example. The lifting control assembly 13 is also connected with the detecting assembly 14. The data processing assembly 12 sends a control signal to the lifting control assembly 13. The lifting control assembly 13 controls the detecting assembly 14 to move up and down between an initial position and a preset position according to the control signal. When detecting missing elements, the detecting assembly 14 is lowered to a preset position and sends detection data to the data processing assembly 12 according to the contact state with elements on the circuit board to be tested. The detection data result may be, for example, that a predetermined position A and a predetermined position B of the detecting assembly 14 are in contact with elements on the circuit board to be tested, while a predetermined position C of the detecting assembly 14 is not in contact with an element on the circuit board to be tested. The data processing assembly 12 stores preset reference data, and after receiving the detection data, compares the detection data with the preset reference data to obtain a detection result of a missing element. For example, the preset reference data is that the position A and position B of the detecting assembly 14 are in contact with elements on the circuit board to be tested, and the position C of the detecting assembly 14 is not in contact with an element on the circuit board to be tested, then the detection data is consistent with the preset reference data, indicating that there is no element missing on the circuit board to be tested. If the preset reference data is that the position A, position B and position C of the detecting assembly 14 are all in contact with elements on the circuit board to be tested, the detection data is inconsistent with the preset reference data, indicating that there is an element missing on the circuit board to be tested at the position C. It can be seen that the device for detecting the missing element on a circuit board provided by some exemplary embodiments of the present disclosure can quickly and efficiently detect whether there is any element missing on a circuit board. Compared with the optical detection method, the present disclosure does not need an image acquisition device, and has the advantages of accurate and simple testing, low cost, improved efficiency and the like.

Optionally, the detecting assembly 14 includes a detection panel 141 and a plurality of detection posts 142.

The detection panel 141 has a plurality of through holes penetrating through the detection panel 141, and each through hole is provided with a detection post 142 therein. The detection panel 141 is configured to be connected with the lifting control assembly 13, drive the detection post 142 to lift under the control of the lifting control assembly 13, and be set to be at a first (electrical) level after the detection panel 141 is lowered to the preset position, and be set to be at a second (electrical) level after the detection panel 141 rises to the initial position.

Figure 2:
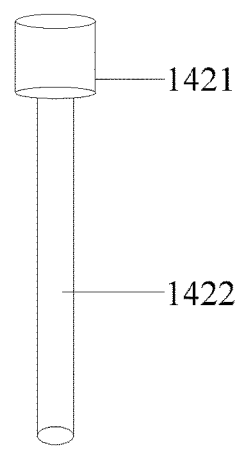
FIG. 2 shows a schematic structural view of a detection post according to some exemplary embodiments.

Referring to the detection posts 142 shown in FIG. 2, each of the detection posts 142 includes a conductive block 1421 and an insulative post 1422 connected to each other, and the insulative post 1422 penetrates through the through hole and is assembled with the through hole in a transition fit manner. Alternatively, the insulative post 1422 can slide in the through hole with damping and can stay at any position in the through hole. The conductive block 1421 is configured to be electrically connected with the data processing assembly 12 and send the first level to the data processing assembly 12 when contacting the detection panel 141, and send the second level to the data processing assembly 12 when detaching from the detection panel 141. The insulative post 1422 is configured to prop up the conductive block 1421 when contacting an element on the circuit board to be tested, so that the conductive block 1421 is detached from the detection panel 141.

In some of the above exemplary embodiments, the detecting assembly 14 includes a detection panel 141 and a plurality of detection posts 142, wherein the detection panel 141 has a plurality of through holes therethrough. Each of the plurality of detection posts 142 comprises a conductive block 1421 and an insulative post 1422, and the insulative post 1422 penetrates through the through hole and is in transition fit with the through hole. When the lifting control assembly 13 controls the detection panel 141 to be lowered, the detection panel 141 drives the detection posts 142 to be lowered. When the detection panel 141 is lowered to the preset position, it is set to be at the first level. If the insulative post 1422 contacts an element on the circuit board to be tested when the detection panel 141 is lowered to the preset position, the conductive block 1421 is propped up to detach the conductive block 1421 from the detection panel 141, as shown in FIG. 1, and the conductive block 1421 keeps to be at the second level. If the insulative post 1422 does not contact an element on the circuit board to be tested because the element is missing on the circuit board to be tested when the detection panel 141 is lowered to the preset position, the conductive block 1421 is not propped up, and the conductive block 1421 is still in contact with the detection panel 141. Since the detection panel 141 is set to be at the first level, the conductive block 1421 is also set to be at the first level due to contact with the detection panel 141 thus, the first level is sent to the data processing assembly 12. The initial state of the data processing assembly 12 can be set to be at the second level. When the first level is sent by the conductive block 1421, it can be determined that the element corresponding to the detection post 142 is missing.

Optionally, the force of gravity on the conductive block 1421 is greater than the resistance of the insulative post 1422 to move in the through hole.

Since the force of gravity exerted on the conductive block 1421 is greater than the resistance of the insulative post 1422 to move in the through hole, the conductive block 1421 falls due to the gravity when the detection panel 141 rises. The detection panel 141 contacts the conductive block 1421 when the detection panel 141 rises to the initial position.

In some of the above exemplary embodiments, during reset, the lifting control assembly 13 controls the detection panel 141 to rise, and the gravity of the conductive block 1421 is greater than the resistance of the insulative post 1422 to move through the hole, so that the conductive block 1421 can fall freely when the detection panel 141 rises. When the detection panel 141 rises to the initial position, the detection panel 141 contacts the conductive block 1421. The detection panel 141 is set to be at the second level after rising to the initial position. After contacting the detection panel 141, the conductive block 1421 is also set to be at the second level and the reset is completed.

Optionally, the detection panel 141 is a metal plate.

In some of the above exemplary embodiments, the detection panel 141 may be a metal plate, and the disclosure does not limit the metal material in detail, and can be set according to actual conditions.

It is possible to set the detection panel 141 to be at a high level when the detection panel 141 is lowered to the preset position, and to set the detection panel 141 to be at a low level when the detection panel 141 rises to the initial position. It is also possible to set the detection panel 141 to be at a low level when the detection panel 141 is lowered to the preset position, and to set the detection panel 141 to be at a high level when the detection panel 141 rises to the initial position. It should be noted that when the detection panel 141 is lowered to the preset position, the detection panel 141 is set to be at a low level, when the detection panel 141 rises to the initial position, the detection panel 141 is set to be at a high level, and a pull-up resistor is required to be provided at a pin where the data processing assembly 12 is connected to the conductive block 1421, so that the pin of the data processing assembly 12 is set to be at a high level in the initial state.

Figure 3:
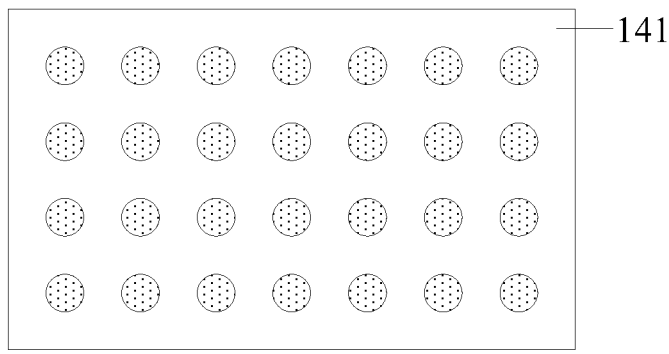
FIG. 3 shows a schematic structural view of a detection panel according to some exemplary embodiments.

Optionally, referring to the detection panel 141 shown in FIG. 3, a plurality of the through holes are arranged in an array in the detection panel 141. Alternatively, the positions of the through holes may also correspond to the positions of elements on the circuit board to be tested.

In some of the above exemplary embodiments, the detection panel 141 may be provided with through holes arranged in an array, for example, as shown in FIG. 3. The through holes are arranged in an array in the detection panel 141, and according to the different positions of elements on a circuit board to be tested, the detection posts 142 can be arranged in through holes at positions corresponding to the positions of the elements. In this way, the detection panel 141 has more universality and can be applied to circuit boards with different specifications and orientations of elements. Also, as shown in FIG. 1, the positions of the through holes correspond to the positions of the elements on the circuit board to be tested. This arrangement can reduce the number of through holes required, thereby simplifying the manufacturing process of the detection panel 141 and decreasing the cost.

Optionally, the through hole is a circular hole, the conductive block 1421 is a cylinder, and the insulative post 1422 is a cylinder. The diameter of the bottom surface of the conductive block 1421 is larger than the diameter of the through hole.

In some of the above exemplary embodiments, the through hole may be a circular hole, and the insulative post 1422 may be a cylinder, so that the movement of the insulative post 1422 in the through hole is more flexible, the resistance is less, and the falling of the conductive block 1421 during reset is more facilitated. The conductive block 1421 may be a cylinder, and the diameter of the bottom surface of the conductive block 1421 is larger than the diameter of the through hole to prevent the detection post 142 from falling out of the through hole after the conductive block 1421 falls. The through hole can also be a square hole, the insulative post 1422 can also be a cuboid, and the conductive block 1421 can also be a square block. The shapes of the through hole, the conductive block 1421 and the insulative post 1422 are not limited to the examples provided in the present disclosure and can be set according to actual conditions.

Optionally, the material of the insulative post 1422 includes at least one of plastic, silica gel, and rubber.

In some of the above exemplary embodiments, the insulative post 1422 may be made of plastic, silica gel, rubber, or the like. The material of insulative post 1422 is not limited to the examples provided in this disclosure and can be set according to actual conditions. The insulative post 1422 is made of insulating material, which can be insulated when contacting with elements on the circuit board to be tested to avoid damage of elements caused by static electricity or electric leakage.

Optionally, the lifting control assembly 13 includes a lifting controller 131 and a lift column 132. The lifting controller 131 is configured to be electrically connected with the data processing assembly 12 and drive the lifting column 132 to lift according to the control signal sent by the data processing assembly 12. The lifting column 132 is configured to be connected with the detection panel 141, and drive the detection panel 141 to lift under the control of the lifting controller 131.

In some of the above exemplary embodiments, the data processing assembly 12 is electrically connected with the lifting controller 131, and the lift column 132 is fixedly connected to the detection panel 141. The data processing assembly 12 sends a control signal to the lifting controller 131 to drive the lifting column 132 to lift, and the lifting column 132 drives the detection panel 141 to lift. For example, when detecting missing elements, the data processing assembly 12 sends a first control signal to the lifting controller 131. The lifting controller 131 drives the lifting column 132 to be lowered according to the first control signal, and in turn the lifting column 132 drives the detection panel 141 to be lowered to the preset position. During reset, the data processing assembly 12 sends a second control signal to the lifting controller 131. The lifting controller 131 drives the lifting column 132 to rise according to the second control signal, and in turn the lifting column 132 drives the detection panel 141 to rise back to the initial position.

Optionally, the driving mode adopted by the lifting control assembly 13 comprises at least one of linear motor driving, pneumatic driving and hydraulic driving.

In some of the above exemplary embodiments, the driving mode adopted by the lifting control assembly 13 comprises at least one of linear motor driving, pneumatic driving and hydraulic driving. This disclosure is not limited to the examples provided, and can be set according to actual conditions.

Optionally, the positioning tray 11 is rectangular.

In some of the above exemplary embodiments, the circuit board to be tested is substantially rectangular, so the positioning tray 11 can also be rectangular so as to be suitable for the circuit board to be tested. The positioning tray 11 may be made of an insulating material, which is not limited to the examples provided in this disclosure, and may be set according to actual conditions.

To sum up, in some of the above exemplary embodiments, the device for detecting the missing element on a circuit board comprises a positioning tray, a data processing assembly, a lifting control assembly and a detecting assembly. Wherein the positioning tray supports and positions the circuit board to be tested; the data processing assembly sends a control signal to the lifting control assembly, receives detection data sent by the detecting assembly, and obtains a detection result of a missing element according to the detection data and preset reference data; the lifting control assembly controls the lifting of the detecting assembly according to the control signal; the detecting assembly moves up and down between an initial position and a preset position under the control of the lifting control assembly, and sends detection data to the data processing assembly according to a contact state with the elements on the circuit board to be tested at the preset position. By means of the device for detecting the missing element on a circuit board disclosed by the invention, whether there is any element missing on the circuit board can be detected quickly and efficiently, and compared with an optical detection method, the present device for detecting a missing element on a circuit board has the advantages of accurate and simple testing, low cost, improved efficiency and the like.

Figure 4:
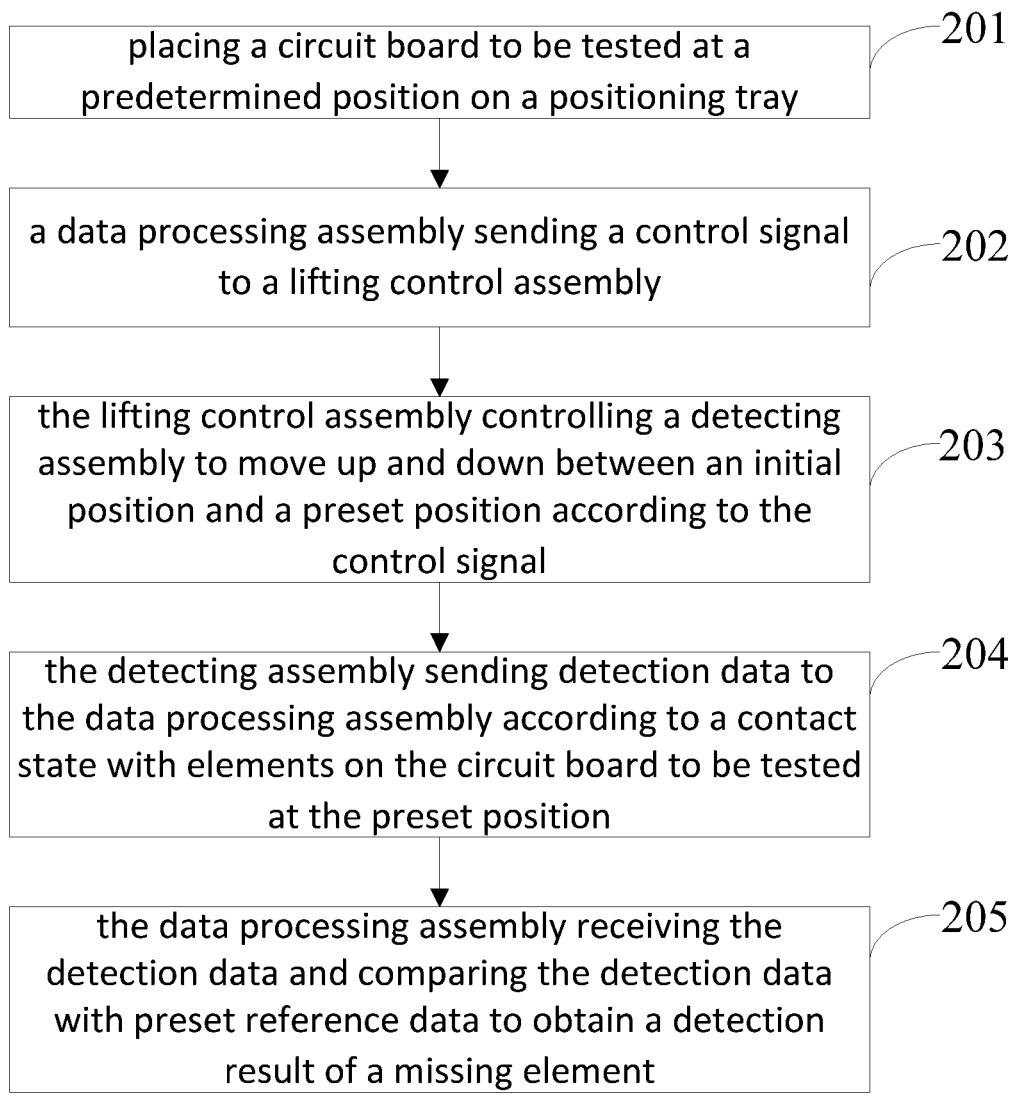
FIG. 4 shows a flowchart of steps of a method for detecting missing elements on a circuit board according to some exemplary embodiments.

Referring to FIG. 4, corresponding to the above-described device for detecting a missing element on a circuit board according to some exemplary embodiments, the disclosure also provides a step flow chart of a method for detecting a missing element on a circuit board.

The method for detecting a missing element on a circuit board comprises the following steps.

Step 201: Placing the circuit board to be tested at a predetermined position on the positioning tray.

Specifically, the positioning tray may be provided with a positioning origin, such as point O shown in FIG. 1. One point on the circuit board to be tested is coincident with the positioning origin of the positioning tray so as to position the circuit board to be tested and avoid detection errors caused by misalignment.

Step 202, Sending a control signal to the lifting control assembly by the data processing assembly; In step 203, controlling the detecting assembly to move up and down between an initial position and a preset position according to the control signal by the lifting control assembly.

When detecting a missing element, the data processing assembly sends a first control signal to the lifting control assembly, and the lifting control assembly controls the detecting assembly to be lowered from an initial position to a preset position according to the first control signal. During reset, the data processing assembly sends a second control signal to the lifting control assembly, and the lifting control assembly controls the detecting assembly to rise from the preset position to the initial position according to the second control signal. Specifically, the thickness a of the circuit board to be tested can be stored in the data processing assembly first. According to the thickness a of the circuit board to be tested and the preset position, the data processing assembly sends a control signal to the lifting control assembly to control the lifting of the detecting assembly. For example, if the distance between an upper surface of the detecting assembly and the preset position is A when the detecting assembly is in the initial position, the detecting assembly is controlled to be lowered B-A to reach the preset position. The thickness a and the preset position of the circuit board to be tested in the present disclosure are not limited in detail and can be set according to actual conditions.

Step 204, Sending detection data to the data processing assembly according to a contact state with elements on the circuit board to be tested at the preset position by the detecting assembly.

Specifically, the detecting assembly includes a detection panel and a plurality of detection posts, and each of detection posts includes an insulative post and a conductive block connected to each other. Specifically, taking the detection panel at the initial position as an example, when the detection of a missing element starts, the lifting control assembly controls the detection panel to be lowered, and when the detection panel is lowered to the preset position, the detection panel is set to be at the first level. When the detection panel is lowered, the detection posts will be driven to be lowered; after the detection panel is lowered to the preset position, if there is no element missing on the circuit board to be tested, the insulative post props up the conductive block when contacting with an element on the circuit board to be tested, so that the conductive block is detached from the detection panel. If there is an element missing on the circuit board to be tested, the insulative post corresponding to the missing element will not contact with the element and will not prop up the conductive block, so the conductive block will also contact the detection panel. The initial states of the conductive blocks are all at the second level. When the detection panel is set to be at the first level at the preset position, the conductive block contacts the detection panel and then send the first level to the data processing assembly, and if the conductive block detaches from the detection panel, it will send the second level to the data processing assembly.

Optionally, when the detection panel is in the initial position, the detection panel is set to be at a second level; wherein the conductive block is also set to be at a second level when contacting the detection panel.

Specifically, during reset, the detection panel rises, the conductive block falls freely due to gravity and contacts the detection panel when the detection panel rises to the initial position. After the detection panel rises to the initial position, the detection panel is set to be at the second level. Since the conductive block is in contact with the detection panel, the conductive block is also set to be at the second level and the reset is completed.

Optionally, the first level is a high level and the second level is a low level; Or alternatively the first level is a low level and the second level is a high level.

Step 205, receiving the detection data and comparing the detection data with preset reference data to obtain a detection result of a missing element by the data processing assembly.

Specifically, during the detection of a missing element, after the detection panel is set to be at the first level at the preset position, the conductive block send the first level to the data processing assembly when contacting the detection panel, and send the second level to the data processing assembly after detaching from the detection panel. Therefore, the data processing assembly can compare the received level with preset reference data. For example, the preset reference data of a position A of the circuit board to be tested is the second level, and if the first level sent by the conductive block is received, it is determined that there is an element missing at the position A; if the second level sent by the conductive block is received, it is determined that there is no element missing at the position A. Or alternatively, under the condition that the preset reference data of the position A on the circuit board to be tested is at the first level, if the second level sent by the conductive block is received, it is determined that there is an element missing at the position A; if the first level sent by the conductive block is received, it is determined that there is no element missing at the position A. The position of each element on the circuit board to be tested corresponding to each conductive block can be determined according to a Gerber file of the circuit board to be tested. Gerber is a set of document formats used by the circuit board industry to describe the images of circuit boards (circuit layers, solder resist layers, character layers, etc.) as well as drilling and milling data, and is a standard format for image conversion in the circuit board industry.

In summary, in some exemplary embodiments, the circuit board to be tested is placed at a predetermined position on the positioning tray; the data processing assembly sends a control signal to the lifting control assembly; the lifting control assembly controls the detecting assembly to move up and down between an initial position and a preset position according to a control signal; the detecting assembly sends detection data to the data processing assembly according to a contact state with elements on the circuit board to be tested at the preset position; The data processing assembly receives the detection data and compares the detection data with preset reference data to obtain a detection result of a missing element. The device and method for detecting a missing element on a circuit board disclosed by the invention can quickly and efficiently detect whether there is any missing element on a circuit board, and have the advantages of accurate and simple testing, low cost, improved efficiency and the like compared with an optical detection method.

Each exemplary embodiment in this specification is described in a progressive manner. What each exemplary embodiment focuses on is the difference from other exemplary embodiments. The same and similar parts between various exemplary embodiments can be referred to each other.

It should be understood that although the basic structure, operating mechanism, various features and beneficial effects of the present disclosure and the specific details of the present disclosure have been set forth in the above description, these contents are merely exemplary, and the specific details thereof, especially within the scope of the principles of the present disclosure, may be specifically changed to the overall scope represented by the broad general meaning claimed in the claims of the present disclosure.

The words "a" or "an" in the claims of the present disclosure do not exclude plural numbers, and are only intended for convenience of description and should not be construed as limiting the scope of protection of the present disclosure. In this disclosure, the terms "first" and "second" are used for descriptive purposes only, and are not to be understood as indicating or implying relative importance, nor are they necessarily used to describe a sequential order or a temporal order. The term "plurality" refers to two or more unless explicitly defined otherwise. "Up", "Down", "Left" and "Right" are only used to indicate the relative positional relationship. When the absolute position of the described object changes, the relative positional relationship may also change accordingly. The term "comprising" may refer to "consisting of" in one embodiment, but may also refer to "including at least a defined category and optionally one or more other categories" in another embodiment. Some embodiments may be described by using the expression "one embodiment" or "some embodiments" along with their derivatives. These terms mean that a particular feature, structure, or characteristic described in connection with an embodiment is included in at least one embodiment. The phrase "in one embodiment" appearing in various places in the application does not necessarily all refer to the same embodiment. The term "and/or" specifically refers to one or more of the items mentioned before and after "and/or". For example, the phrase "item 1 and/or item 2" and similar phrases may relate to one or more of items 1 and 2. Those skilled in the art will understand the term "substantially" herein, such as in "substantially consisting of". The term "substantially" may also include embodiments having "wholly," "completely," "all," etc. Therefore, in the embodiment, the adjective is also substantially removable. Where applicable, the term "substantially" may also refer to 90% or more, such as 95% or more, specifically 99% or more, even more specifically 99.5% or more, including 100%.

Unless otherwise defined, all technical and scientific terms used in this specification have the same meaning as commonly understood by those skilled in the art to which this disclosure belongs.

It should be understood that the device and method for detecting a missing element on a circuit board of the present disclosure are not limited to the above examples. Any variations or equivalents occur to any person skilled in the art, after reading the present disclosure, will be covered in the claims claimed in the present disclosure if he or she combines with the prior art without creative effort.

The invention claimed is:

1. A device for detecting a missing element on a circuit board comprising a positioning tray, a data processing assembly, a lifting control assembly and a detecting assembly, wherein:
   the positioning tray is configured to support and position a circuit board to be tested;
   the data processing assembly is configured to be respectively connected with the lifting control assembly and the detecting assembly, send a control signal to the lifting control assembly, receive detection data sent by the detecting assembly, and compare the detection data with preset reference data to obtain a detection result of the missing element;
   the lifting control assembly is configured to be connected with the detecting assembly and control a lifting of the detecting assembly according to the control signal; and
   the detecting assembly is configured to move up and down between an initial position and a preset position under a control of the lifting control assembly, and send the detection data to the data processing assembly according to a contact state with elements on the circuit board to be tested at the preset position,
   wherein the detecting assembly comprises a detection panel and a plurality of detection posts,
   wherein the detection panel is provided with a plurality of through holes penetrating through the detection panel, the detection panel is configured to be connected with the lifting control assembly, drive the detection posts to lift under a control of the lifting control assembly, be set to be at a first level after the detection panel is lowered to the preset position, and be set to be at a second level after the detection panel rises to the initial position; and
   wherein each of the detection posts comprises a conductive block and an insulative post connected to each other, the insulative post penetrates through the through hole and is assembled with the through hole in a transition fit manner, the conductive block is configured to be electrically connected with the data processing assembly, and sends the first level to the data processing assembly when the detection panel is lowered to the preset position and the conductive block contacts the detection panel, and sends the second level to the data processing assembly when the detection panel is lowered to the preset position and the conductive block detaches from the detection panel; the insulative post is configured to prop up the conductive block to detach the conductive block from the detection panel when contacting with an element on the circuit board to be tested.

2. The device according to claim 1, wherein a force exerted by gravity on the conductive block is greater than a resistance of the insulative post moving in the through hole, so that the conductive block falls due to the gravity when the detection panel rises, and contacts the detection panel after the detection panel rises to the initial position.

3. The device according to claim 1, wherein the detection panel is a metal plate.

4. The device according to claim 1, wherein the plurality of through holes are arranged in an array in the detection panel.

5. The device according to claim 1, wherein positions of the plurality of through holes correspond to positions of the elements on the circuit board to be tested one by one.

6. The device according to claim 1, wherein each through hole is a circular hole, the conductive block is a cylinder, the insulative post is a cylinder, and a diameter of a bottom surface of the conductive block is larger than a diameter of the through hole.

7. The device according to claim 1, wherein a material of the insulative post comprises at least one of plastic, silica gel or rubber.

8. The device according to claim 1, wherein the lifting control assembly comprises a lifting controller and a lifting column,
   wherein the lifting controller is configured to be electrically connected with the data processing assembly and drive the lifting column to lift according to the control signal sent by the data processing assembly; and wherein the lifting column is configured to be connected with the detection panel and drive the detection panel to lift under a control of the lifting controller.

9. The device according to claim 8, wherein a driving mode adopted by the lifting control assembly comprises at least one of a linear motor driving, a pneumatic driving or a hydraulic driving.

10. The device according to claim 1, wherein the positioning tray is rectangular.

11. A method for detecting a missing element on a circuit board using a device for detecting the missing element on the circuit board, wherein the device for detecting the missing element on the circuit board comprises a positioning tray, a data processing assembly, a lifting control assembly and a detecting assembly, wherein the method comprises following steps:
placing a circuit board to be tested at a predetermined position on the positioning tray;
sending a control signal to the lifting control assembly by the data processing assembly;
controlling the detecting assembly to move up and down between an initial position and a preset position according to the control signal by the lifting control assembly;
the detecting assembly sending detection data to the data processing assembly according to a contact state with elements on the circuit board to be tested at the preset position; and
receiving the detection data and comparing the detection data with preset reference data to obtain a detection result of a missing element by the data processing assembly,
wherein the detecting assembly comprises a detection panel and a plurality of detection posts, each of the detection posts comprises an insulative post and a conductive block connected to each other;
the detecting assembly sending detection data to the data processing assembly according to the contact state with elements on the circuit board to be tested at the preset position comprises:
setting the detection panel to be at a first level when the detection panel is lowered to the preset position and to be at a second level when the detection panel rises to the initial position;
sending the first level to the data processing assembly when the detection panel is lowered to the preset position and the conductive block contacts the detection panel, and sending the second level to the data processing assembly when the detection panel is lowered to the preset position and the conductive block detaches from the detection panel; and
propping up the conductive block to detach the conductive block from the detection panel when the insulative post is in contact with an element on the circuit board to be tested.

12. The method according to claim 11, wherein the method further comprises:
when the detection panel is in the initial position, setting the detection panel to the second level, and when the detection panel is in the initial position, setting the conductive block to be in contact with the detection panel, and setting a level of the conductive block to the second level.

13. The method according to claim 11, wherein the first level is a high level and the second level is a low level; or alternatively the first level is a low level and the second level is high level.

* * * * *